United States Patent
Carter et al.

(10) Patent No.: US 7,218,170 B1
(45) Date of Patent: May 15, 2007

(54) MULTI-POLE CURRENT MIRROR FILTER

(75) Inventors: Keith A. Carter, Rancho Palos Verdes, CA (US); Arya Reza Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 345 days.

(21) Appl. No.: 10/444,245

(22) Filed: May 23, 2003

(51) Int. Cl.
*H03B 1/00* (2006.01)
*H03K 5/00* (2006.01)
*H04B 1/10* (2006.01)

(52) U.S. Cl. .................. 327/552; 455/72; 327/148; 327/157; 327/538; 327/543; 323/315; 331/17; 331/25; 331/183; 331/185

(58) Field of Classification Search .......... 455/75; 327/538, 543, 148, 157; 323/315; 331/183, 331/185, 17, 25
See application file for complete search history.

(56) References Cited

U.S. PATENT DOCUMENTS

| | | | | |
|---|---|---|---|---|
| 3,691,394 A | * | 9/1972 | Davis | 307/3 |
| 3,924,199 A | * | 12/1975 | Pearlman | 330/107 |
| 5,469,092 A | * | 11/1995 | Itakura | 327/103 |
| 5,572,162 A | * | 11/1996 | Cotreau | 327/552 |
| 5,877,654 A | * | 3/1999 | Fong et al. | 330/292 |
| 5,914,633 A | * | 6/1999 | Comino et al. | 327/553 |
| 6,510,313 B1 | * | 1/2003 | Rapeli | 455/323 |
| 6,744,277 B1 | * | 6/2004 | Chang et al. | 326/37 |
| 6,788,161 B2 | * | 9/2004 | Vilander | 331/185 |
| 2002/0176022 A1 | * | 11/2002 | Ahn | 348/607 |
| 2003/0197549 A1 | * | 10/2003 | Rasmussen et al. | 327/538 |

* cited by examiner

*Primary Examiner*—Quochien B. Vuong
*Assistant Examiner*—Zhiyu Lu
(74) *Attorney, Agent, or Firm*—Garlick Harrison & Markison; James A. Harrison

(57) ABSTRACT

A current mirror with selectable filter poles provides a selected low pass filtering function to a DC bias signal generated by the current mirror. Coupled between a first MOSFET and second MOSFET of the current mirror, a low pass filter with selectable filter poles comprises a plurality of resistor-configured MOSFETs coupled to at least one capacitor-configured MOSFET to provide one of a fast settle time and improved filtering for the current mirror in one embodiment of the invention. A first resistor-configured MOSFETs, biased by logic and bias circuitry, provides a low frequency filter pole that provides an improved filtering for the current mirror. A second resistor-configured MOSFET provides a high frequency filter pole that provides a fast charge time to meet a settle time requirement.

21 Claims, 10 Drawing Sheets low pass filter repsonse curve low pass filter

MULTI-POLE CURRENT MIRROR FILTER

BACKGROUND

1. Technical Field

The present invention relates to wireless communications and, more particularly, wideband wireless communication systems.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with the particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives an inbound RF signal via the antenna and amplifies it. The one or more intermediate frequency stages mix the amplified RF signal with one or more local oscillations to convert the amplified RF signal into a baseband signal or an intermediate frequency (IF) signal. As used herein, the term "low IF" refers to both baseband and intermediate frequency signals. A filtering stage filters the low IF signals to attenuate unwanted out-of-band signals to produce a filtered signal. The data recovery stage recovers raw data from the filtered signal in accordance with the particular wireless communication standard.

One problem of using low intermediate frequencies, however, is satisfying an image rejection requirement for the systems. The image rejection requirement for the down-conversion is hard to meet and is usually limited to about −40 dB. Thus, this low intermediate frequency approach is limited for narrow band or low data rate systems. Wideband or high data rate systems require an intermediate frequency that is not low enough for the integration of channel selection filters given the technology that is available today for semiconductor processes. There is a need, therefore, for a wireless transceiver system that allows for full integration on-chip of circuit designs that support high data rate and wideband communications. Stated differently, there is a need for wireless transceiver systems formed on an integrated circuit that have the capability to convert between baseband and a specified RF band in a single step to avoid the image rejection problem discussed above.

Because many wireless transceivers often operate on batteries or stored energy, designs are continuously being pursued which reduce power consumption and place a circuit into a standby, sleep, or idle mode to reduce power consumption. As communication devices increase in speed, however, the amount of time for a device to transition from an idle or standby mode to a fully operational mode is reduced. For example, some receiver circuits are placed in idle or standby while a transceiver is transmitting. As soon as data is received, the circuit is powered back up. For today's fast transmission rates, the time to transition to stead state is small. This means that filters must be designed to have fast charge times. With today's speed, however, a filter that can meet settle time requirements may not provide optimal filtering from noise.

What is needed, therefore, is an apparatus and method that reduces or substantially eliminates the effects of noise while meeting settle time requirements.

SUMMARY OF THE INVENTION

To solve these problems and others, a current mirror with a low pass noise filter having selectable filter poles for providing a selected low pass filtering function to a DC bias signal having noise components generated by the current mirror and other sources to meet a fast settle time and to provide improved filtering is presented. Coupled between a first MOSFET and a second MOSFET of the current mirror, the low pass noise filter with selectable filter poles comprises a plurality of resistor-configured MOSFETs coupled to at least one capacitor-configured MOSFET to provide one of a fast settle time and improved filtering for the current mirror in one embodiment of the invention.

A first resistor-configured MOSFET and a second resistor-configured MOSFET, of the plurality of resistor-configured MOSFETs, are biased to have a resistive value, the first resistor-configured MOSFET having a resistive value that is at least ten times greater than a resistive value of the second resistor-configured MOSFET. The first resistor-configured MOSFET, when biased into a linear mode of operation with the at least one capacitor-configured MOSFET, has a resistive value that forms a low frequency filter pole that provides improved filtering for the current mirror. Alternatively, the second resistor-configured MOSFET, when biased into a linear mode of operation with the at least one capacitor-configured MOSFET, has a resistive value that forms a high frequency filter pole that provides a fast charge time to meet a settle time requirement. Additional resistor-configured MOSFETs, of the plurality of resistor-configured MOSFETs, are formed to provide additional filtering for the current mirror.

Logic and bias circuitry selectably biases at least one resistor-configured MOSFET, of the plurality of resistor-configured MOSFETs, into one of a linear mode of operation (functioning as a resistor) and a high impedance mode of operation. The logic and bias circuitry selectably biases the first resistor-configured MOSFET to have a resistive value at least ten times greater than a resistive value of the second resistor-configured MOSFET. In one embodiment, the resistive value of the first resistor-configured MOSFET is at least 100 times greater than the resistive value of the second resistor-configured MOSFET.

The logic and bias circuitry further couples a second and a third selectable current source into an operational mode in order to provide additional bias signals to the selectable filter pole circuitry in order to further reduce the current mirror charge time.

Other aspects of the present invention will become apparent with further reference to the drawings and specification, which follow.

BRIEF DESCRIPTION OF THE DRAWINGS

A better understanding of the present invention can be obtained when the following detailed description of the preferred embodiment is considered with the following drawings, in which.

DETAILED DESCRIPTION OF THE DRAWINGS

Figure 1:
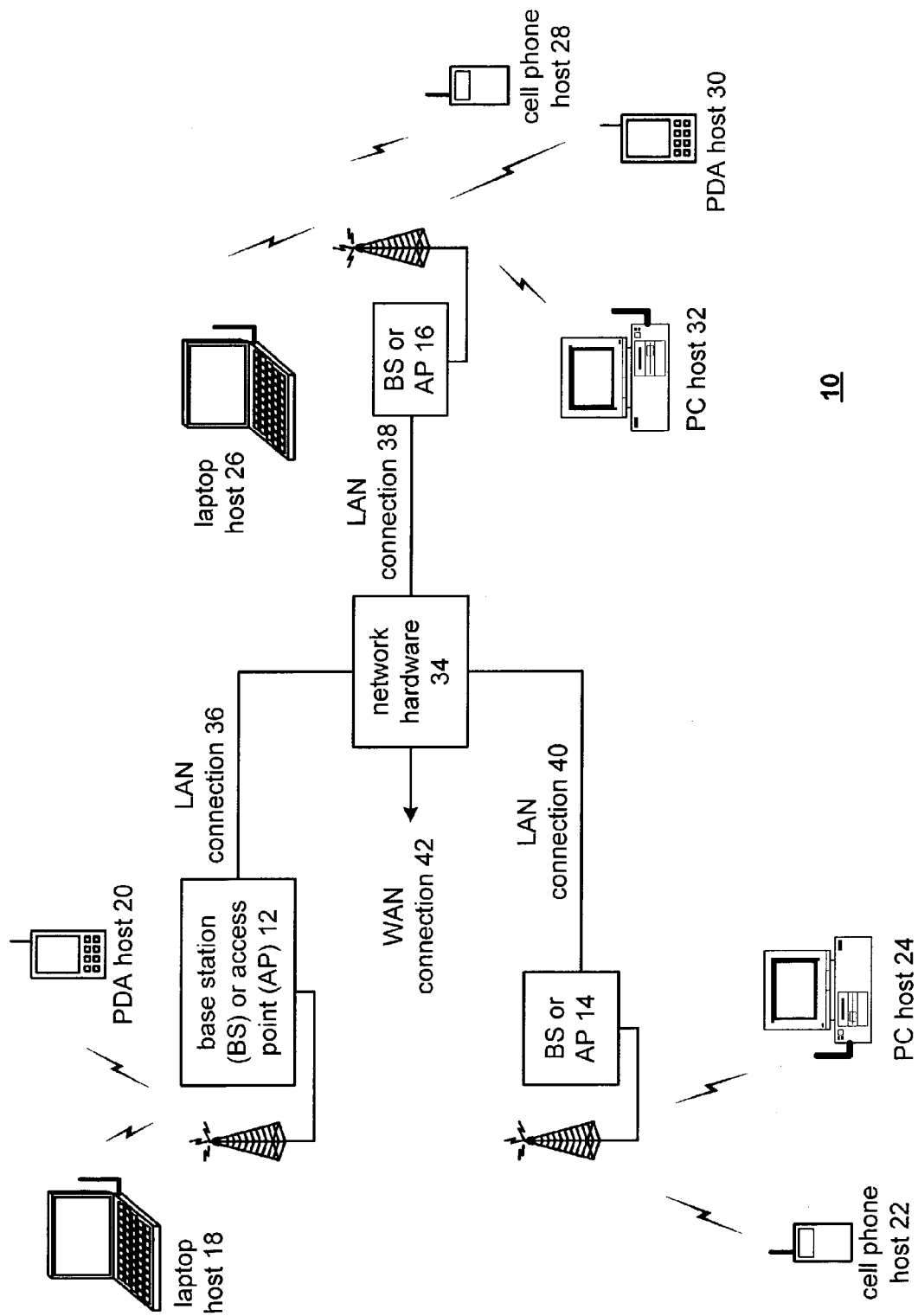
FIG. 1 is a functional block diagram illustrating a communication system that includes a plurality of base stations or access points, a plurality of wireless communication devices and a network hardware component.

FIG. 1 is a functional block diagram illustrating a communication system 10 that includes a plurality of base stations or access points (AP) 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12–16 are operably coupled to network hardware component 34 via local area network (LAN) connections 36, 38 and 40. Network hardware component 34, which may be a router, switch, bridge, modem, system controller, etc., provides a wide area network connection 42 for communication system 10. Each of the base stations or access points 12–16 has an associated antenna or antenna array to communicate with the wireless communication devices in its area. Typically, wireless communication devices 18–32 register with the particular base stations or access points 12–16 to receive services from communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio.

Figure 2:
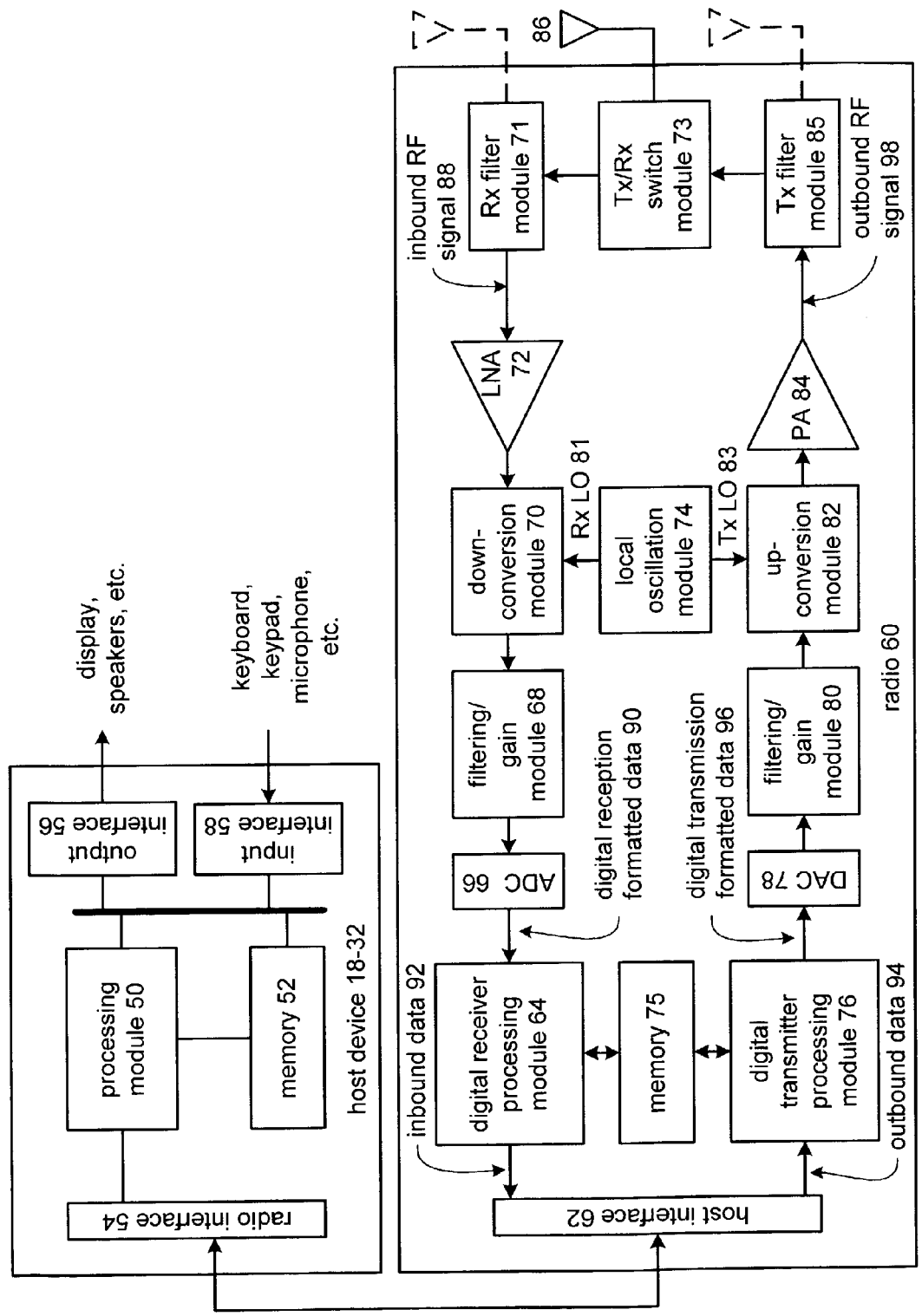
FIG. 2 is a schematic block diagram illustrating a wireless communication host device and an associated radio.

FIG. 2 is a schematic block diagram illustrating a wireless communication host device 18–32 and an associated radio 60. For cellular telephone hosts, radio 60 is a built-in component. For personal digital assistants hosts, laptop hosts, and/or personal computer hosts, the radio 60 may be built-in or an externally coupled component.

As illustrated, wireless communication host device 18–32 includes a processing module 50, a memory 52, a radio interface 54, an input interface 58 and an output interface 56. Processing module 50 and memory 52 execute the corresponding instructions that are typically done by the host device. For example, for a cellular telephone host device, processing module 50 performs the corresponding communication functions in accordance with a particular cellular telephone standard.

Radio interface 54 allows data to be received from and sent to radio 60. For data received from radio 60 (e.g., inbound data), radio interface 54 provides the data to processing module 50 for further processing and/or routing to output interface 56. Output interface 56 provides connectivity to an output device such as a display, monitor, speakers, etc., such that the received data may be displayed. Radio interface 54 also provides data from processing module 50 to radio 60. Processing module 50 may receive the outbound data from an input device such as a keyboard, keypad, microphone, etc., via input interface 58 or generate the data itself. For data received via input interface 58, processing module 50 may perform a corresponding host function on the data and/or route it to radio 60 via radio interface 54.

Radio 60 includes a host interface 62, a digital receiver processing module 64, an analog-to-digital converter 66, a filtering/gain module 68, a down-conversion module 70, a low noise amplifier 72, a receiver filter module 71, a transmitter/receiver (Tx/Rx) switch module 73, a local oscillation module 74, a memory 75, a digital transmitter processing module 76, a digital-to-analog converter 78, a filtering/gain module 80, an up-conversion module 82, a power amplifier 84, a transmitter filter module 85, and an antenna 86. The antenna 86 is shared by the transmit and receive paths as regulated by the Tx/Rx switch module 73.

The antenna implementation will depend on the particular standard to which the wireless communication device is compliant.

Digital receiver processing module 64 and digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, and modulation. Digital receiver and transmitter processing modules 64 and 76, respectively, may be implemented using a shared processing device, individual processing devices, or a plurality of processing devices. Such a processing device may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. Memory 75 may be a single memory device or a plurality of memory devices. Such a memory device may be a read-only memory, random access memory, volatile memory, non-volatile memory, static memory, dynamic memory, flash memory, and/or any device that stores digital information. Note that when digital receiver processing module 64 and/or digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. Memory 75 stores, and digital receiver processing module 64 and/or digital transmitter processing module 76 executes, operational instructions corresponding to at least some of the functions illustrated herein.

In operation, radio 60 receives outbound data 94 from wireless communication host device 18–32 via host interface 62. Host interface 62 routes outbound data 94 to digital transmitter processing module 76, which processes outbound data 94 in accordance with a particular wireless communication standard (e.g., IEEE 802.11a, IEEE 802.11b, Bluetooth, etc.) to produce digital transmission formatted data 96. Digital transmission formatted data 96 will be a digital baseband signal or a digital low IF signal, where the low IF typically will be in the frequency range of one hundred kilohertz to a few megahertz.

Digital-to-analog converter 78 converts digital transmission formatted data 96 from the digital domain to the analog domain. Filtering/gain module 80 filters and/or adjusts the gain of the analog baseband signal prior to providing it to up-conversion module 82. Up-conversion module 82 directly converts the analog baseband signal, or low IF signal, into an RF signal based on a transmitter local oscillation 83 provided by local oscillation module 74. Power amplifier 84 amplifies the RF signal to produce an outbound RF signal 98, which is filtered by transmitter filter module 85. The antenna 86 transmits outbound RF signal 98 to a targeted device such as a base station, an access point and/or another wireless communication device.

Radio 60 also receives an inbound RF signal 88 via antenna 86, which was transmitted by a base station, an access point, or another wireless communication device. The antenna 86 provides inbound RF signal 88 to receiver filter module 71 via Tx/Rx switch module 73, where Rx filter module 71 bandpass filters inbound RF signal 88. The Rx filter module 71 provides the filtered RF signal to low noise amplifier 72, which amplifies inbound RF signal 88 to produce an amplified inbound RF signal. Low noise amplifier 72 provides the amplified inbound RF signal to down-conversion module 70, which directly converts the amplified inbound RF signal into an inbound low IF signal or baseband signal based on a receiver local oscillation 81 provided by local oscillation module 74. Down-conversion module 70 provides the inbound low IF signal or baseband signal to filtering/gain module 68. Filtering/gain module 68 may be implemented in accordance with the teachings of the present invention to filter and/or attenuate the inbound low IF signal or the inbound baseband signal to produce a filtered inbound signal.

Analog-to-digital converter 66 converts the filtered inbound signal from the analog domain to the digital domain to produce digital reception formatted data 90. Digital receiver processing module 64 decodes, descrambles, demaps, and/or demodulates digital reception formatted data 90 to recapture inbound data 92 in accordance with the particular wireless communication standard being implemented by radio 60. Host interface 62 provides the recaptured inbound data 92 to the wireless communication host device 18–32 via radio interface 54.

As one of average skill in the art will appreciate, the wireless communication device of FIG. 2 may be implemented using one or more integrated circuits. For example, the host device may be implemented on a first integrated circuit, while digital receiver processing module 64, digital transmitter processing module 76 and memory 75 may be implemented on a second integrated circuit, and the remaining components of radio 60, less antenna 86, may be implemented on a third integrated circuit. As an alternate example, radio 60 may be implemented on a single integrated circuit. As yet another example, processing module 50 of the host device and digital receiver processing module 64 and digital transmitter processing module 76 may be a common processing device implemented on a single integrated circuit. Further, memory 52 and memory 75 may be implemented on a single integrated circuit and/or on the same integrated circuit as the common processing modules of processing module 50, digital receiver processing module 64, and digital transmitter processing module 76. As will be described, it is important that accurate oscillation signals are provided to mixers and conversion modules. A source of oscillation error is noise coupled into oscillation circuitry through integrated circuitry biasing circuitry. One embodiment of the present invention reduces the noise by providing a selectable pole low pass filter in current mirror devices formed within the one or more integrated circuits.

The wireless communication device of FIG. 2 is one that may be implemented to include either a direct conversion from RF to baseband and baseband to RF or for a conversion by way of a low intermediate frequency. In either implementation, however, for up-conversion module 82 and down-conversion module 70, it is required to provide accurate frequency conversion. For down-conversion module 70 and up-conversion module 82 to accurately mix a signal, however, it is important that local oscillation module 74 provide an accurate local oscillation signal for mixing with the baseband or RF by up-conversion module 82 and down-conversion module 70, respectively. Accordingly, local oscillation module 74 includes circuitry for adjusting an output frequency of a local oscillation signal provided therefrom. Local oscillation module 74 receives a frequency correction input that it uses to adjust an output local oscillation signal to produce a frequency corrected local oscillation signal output. While local oscillation module 74, up-conversion module 82 and down-conversion module 70 are implemented to perform direct conversion between baseband and RF, it is understood that the principles herein may also be applied readily to systems that implement an intermediate frequency conversion step at a low intermediate frequency.

Figure 3B:
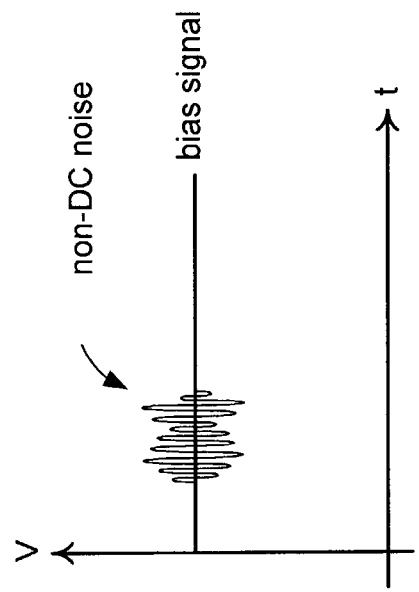
FIGS. 3A and 3B illustrate a current mirror with selectable filter poles according to one embodiment of the present invention and a DC bias signal containing high frequency noise, respectively.
Figure 3A:
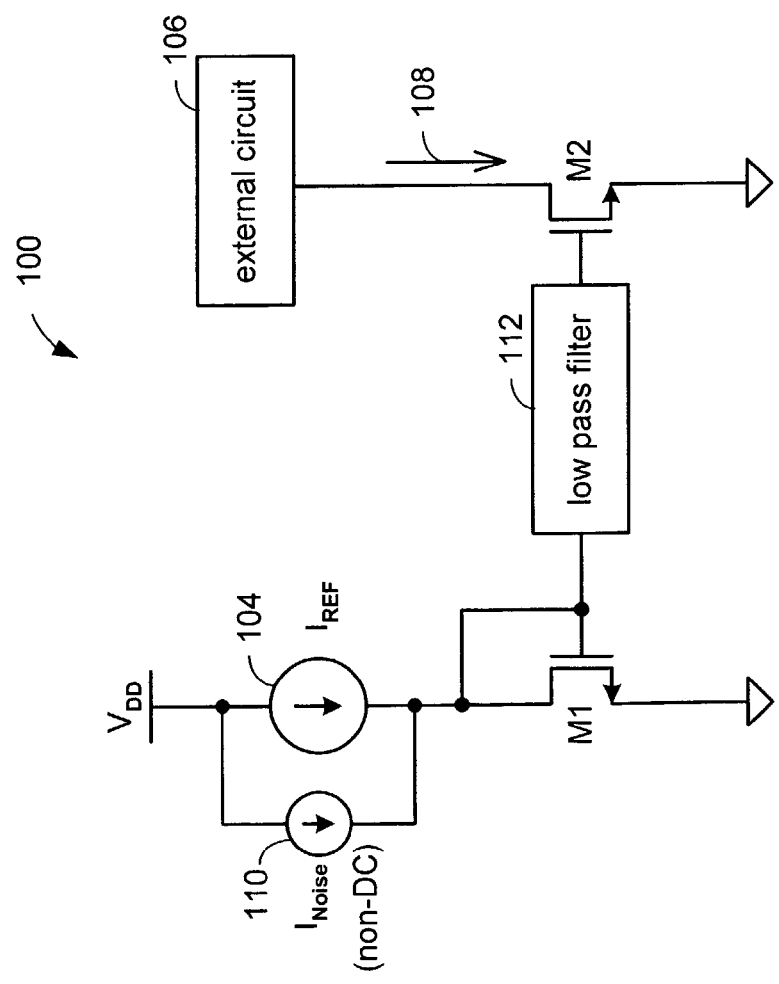

FIGS. 3A and 3B illustrate a current mirror with selectable filter poles according to one embodiment of the present invention and a DC bias signal containing high frequency noise, respectively. A current mirror, shown generally at 100 in FIG. 3A, comprises a reference current source 104, a pair of current mirrored devices, namely, first MOSFET M1 and second MOSFET M2. In an integrated circuit (IC), biasing MOSFET devices, such as buffers, mixers and amplifiers, utilizes constant current sources to provide biasing signals. One technique to generate these bias signals is to generate a constant current, and replicate the current using a current mirror. The current mirror utilizes a constant reference current source coupled to the drain of a diode-connected MOSFET wherein the gate is connected to the drain. The source of the diode-connected MOSFET is connected to circuit common. Due to the constant reference current, the diode-connected MOSFET will have a constant gate-to-source voltage. The gate of the diode-connected MOSFET, and the constant gate-to-source voltage, is coupled to various MOSFET devices in the IC. Typically, the channel geometry of the mirrored MOSFETs are proportionally larger (2× or more) than the diode-connected MOSFET thereby generating bias signals that are proportionally larger (2× or more) than the reference current. This fact allows the diode-connected MOSFET to be smaller, i.e., consume less IC real estate, than the mirrored MOSFETs. Continuing with the discussion of FIG. 3A, first MOSFET M1 is configured as a diode-connected MOSFET. Reference current, $I_{REF}$, will be mirrored in second MOSFET M2 such that bias signal 108 provided to external circuit 106 will be based on reference current 104.

As is shown in FIG. 3A, current source 104 is coupled in parallel with a source 110, which represents the various noise components. Source 110, $I_{NOISE}$, represents noise components such as Thermal Noise, Shot Noise, glitches, clock noise and KT/C noise. The KT/C noise source is the effective noise of a resistive element in the presence of a filtering capacitor. The thermal noise of the resistive element is shaped by the low pass filter and coupled across the capacitor. The total noise measured across the capacitor is the spectral density of the noise integrated over the noise bandwidth. Without some type of noise reduction, these noise components will be seen as additional current components and will be replicated in bias signal 108 thereby coupling the noise to external circuit 106. Noise in the bias signal contributes to frequency instability in oscillator circuits that increases phase noise and spurious signals that contribute to jitter in digital circuits resulting in problems such as trigger point errors and symbol rate errors in coding/decoding circuits. One method of the present invention includes a low pass filter 112 coupled between the gates of first MOSFET M1 and second MOSFET M2. Low pass filter 112 is formed with selectable poles wherein at least one filter pole represents a corner frequency low enough to filter out the noise components of interest.

FIG. 3B illustrates a DC bias signal containing high frequency noise from noise source 110 of FIG. 3A. Low pass filter 112 of FIG. 3A is formed with selectable filter poles to provide a fast settle time while removing low frequency/non-DC noise and then to provide improved filtering for the noise source. The present invention is formed with selectable filter poles in order to set a corner frequency below the noise frequency in order to remove noise components of interest.

Figure 4B:
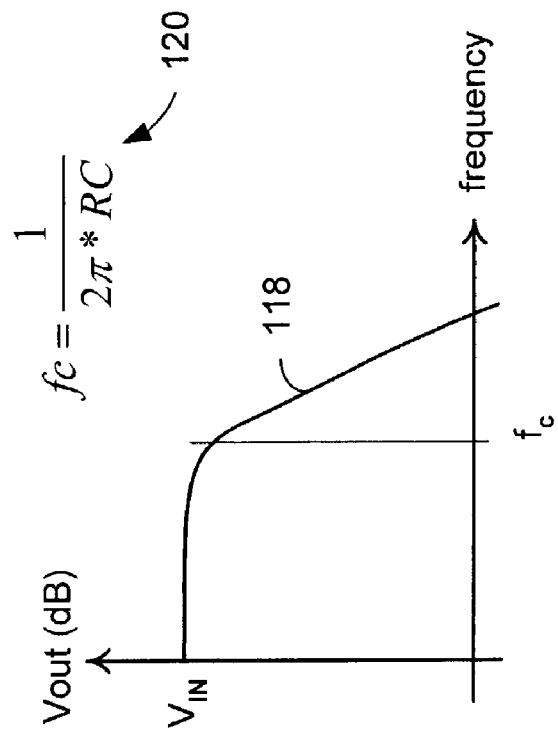
FIGS. 4A and 4B represent a low pass filter and the low pass filter response curve, respectively.
Figure 4A:
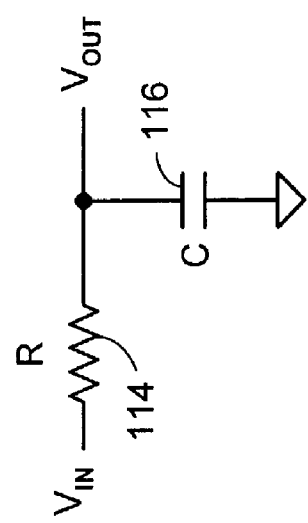

FIGS. 4A and 4B represent the low pass filter of FIG. 3 and a low pass filter response curve, respectively. The low pass filter shown in FIG. 4A includes a resistor 114 coupled to a capacitor 116 forming an effective frequency sensitive voltage divider. Capacitor 116 in the low pass filter represents a short circuit at high frequency and an effective open at low frequency, thus the output voltage, $V_{OUT}$, will vary from $V_{IN}$ (at low frequencies) to substantially zero (at high frequencies). FIG. 4B illustrates the response curve of the low pass filter of FIG. 4A. As can be seen in FIG. 4B, at DC, or zero frequency, $V_{OUT}$ is effectively equal to $V_{IN}$. As the frequency increases, however, $V_{OUT}$ will eventually reach a corner frequency, $f_c$, where the response curve rolls off an approximate −20 db per decade, as illustrated by response curve 118. The response curve illustrated in FIG. 4B is defined by equation 120. As the frequency continues to increase, the impedance of capacitor 116 decreases until it effectively represents a short circuit, thus $V_{OUT}$ will be substantially zero.

Figure 5B:
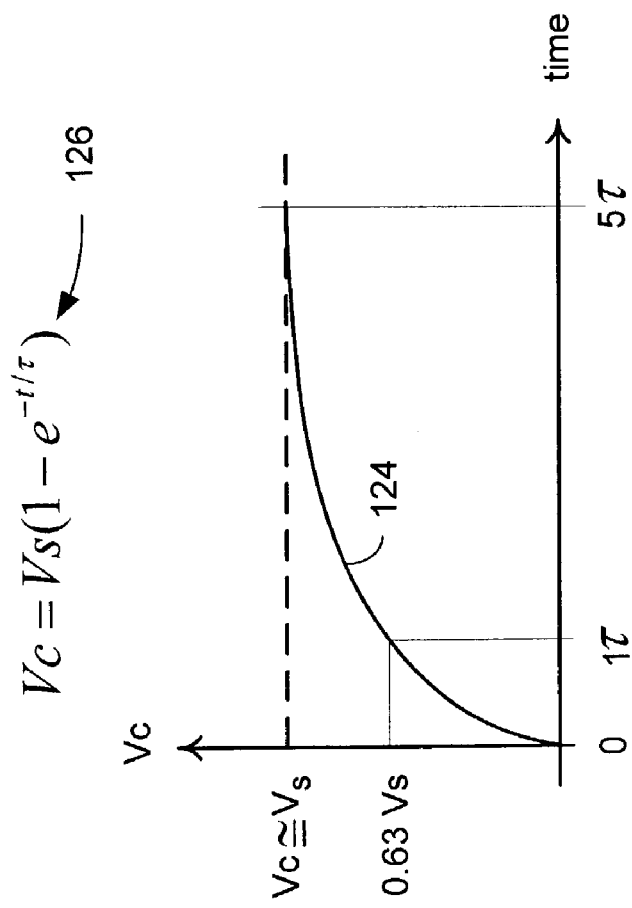
FIGS. 5A and 5B illustrate the charging function of a low pass filter.
Figure 5A:
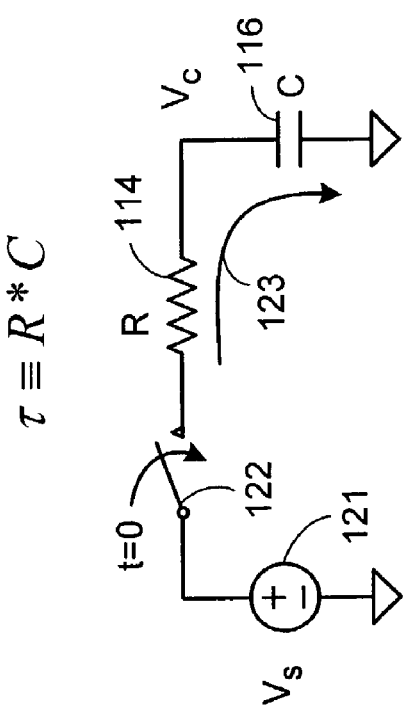

FIGS. 5A and 5B illustrate a charging function of the low pass filter of FIG. 3. One problem facing designers is selecting a time constant created by resistor 114 and capacitor 116 that meets a charge time requirement but has components that are large enough to meet filtering requirements. As is shown in FIG. 5A, resistor 114, capacitor 116, switch 122, and voltage source 121 are connected in series. Assuming capacitor 116 is completely discharged when switch 122 is closed at time t=0, a charge current 123 will start to charge capacitor 116 through resistor 114. As is known by one of average skill in the art, the time constant, $\tau$ (tau), of FIG. 5A is equal to R*C. As is further known by one of average skill in the art, it takes approximately 5 time constants before C is fully charged. The exponential charge curve 124 of capacitor 116, shown in FIG. 5B, is defined by the equation shown generally at 126. Exponential charge curve 124 illustrates the voltage across capacitor 116 as it charges up responsive to charge current 123. As can be seen in FIG. 5B, at one $\tau$ capacitor 116 will have charged to approximately 63% of the value of voltage source 121, and by five $\tau$, the voltage across capacitor 116 is effectively equal to the value of voltage source 121. The charging function of capacitor 116 illustrates the tradeoff between two mutually explicit design goals, namely, a capacitor large enough to filter out the noise while being small enough to quickly charge to meet a charge time settling requirement. While the time constant may be theoretically be changed by changing capacitance, selectably adding resistance is more efficient in terms of IC real-estate and is therefore preferred.

Figure 6:
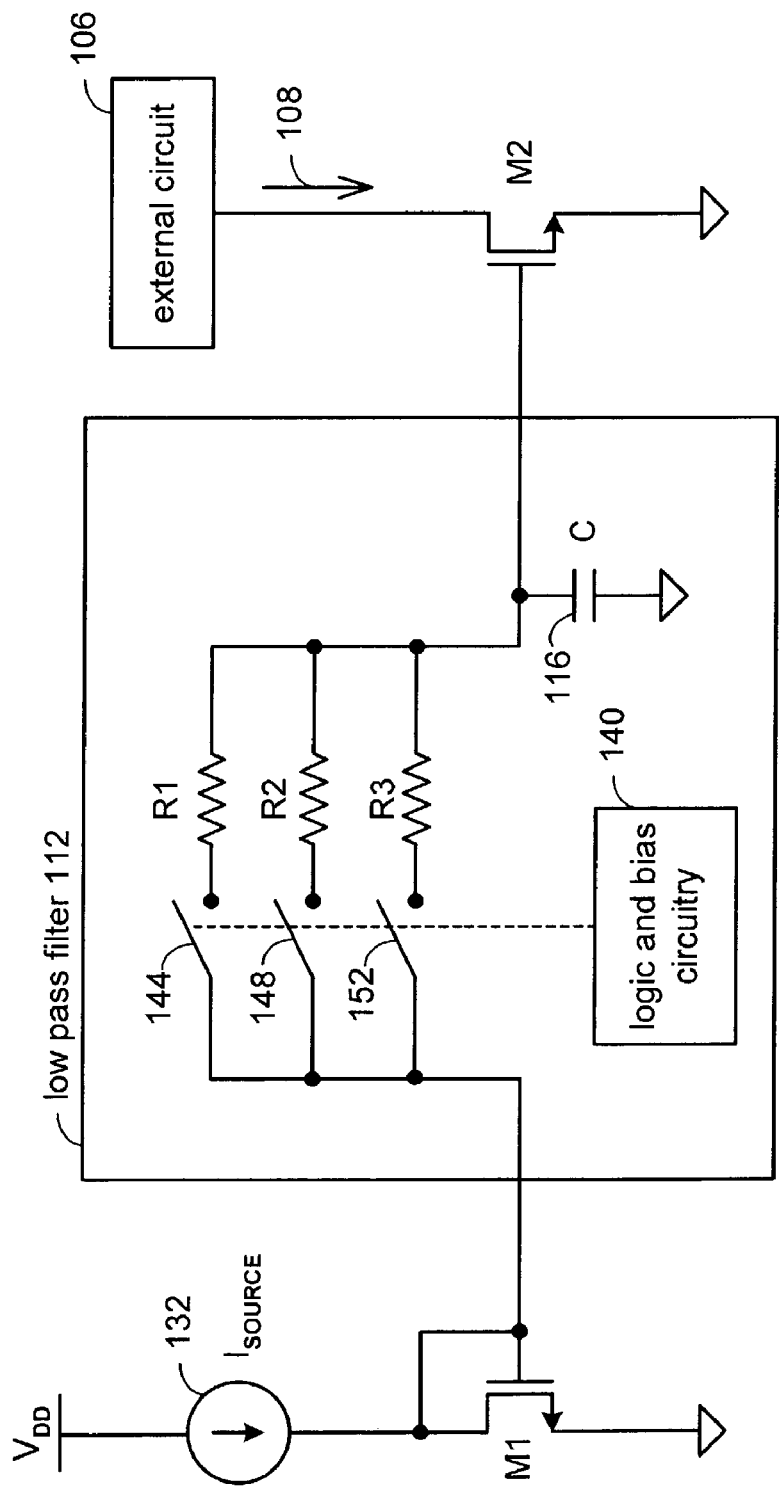
FIG. 6 illustrates a current mirror with selectable filter poles, according to one embodiment of the present invention.

FIG. 6 illustrates a current mirror with selectable filter poles, according to one embodiment of the present invention. A current source 132 represents the reference current and contribution from noise sources as previously discussed. Current source 132 is coupled to the drain of first MOSFET M1. The source of first MOSFET M1 is coupled to circuit common, while the gate of first MOSFET M1 is connected to the drain of first MOSFET M1. Second MOSFET M2 is coupled to provide bias signal 108 to external circuit 106. Low pass filter 112 is coupled between the gate of first MOSFET M1 and the gate of second MOSFET M2. As is shown in FIG. 6, low pass filter 112 comprises a plurality of series connected switches and selectable resistors coupled in parallel and controlled by logic and bias circuitry 140. Capacitor 116, is further coupled to the gate of second MOSFET M2. The values of the plurality of selectable resistors, namely, R1, R2 and R3, are chosen to provide selectable filter poles that provide both a fast charge time and meet a filtering requirement. In one embodiment, a resistor is coupled between the gates of the first and second MOSFETs as well as a selectable resistor. Logic and bias circuitry 140 will close at least one switch of the plurality of series connected switches 144–152, to couple in the selected resistor, thereby establishing the selectable filter pole. For example, the resistance of R1 could be chosen to be a small value to establish a high frequency filter pole that will meet a fast charge time requirement, while the resistances of R2 and R3 could be chosen to be relatively large values to generate a variety of low frequency filter poles to meet an improved filtering requirement. Logic and bias circuitry 140 comprises a plurality of combinational logic typically controlled by one of a baseband processor or similar controlling device, as is known by one of average skill in the art.

Figure 7:
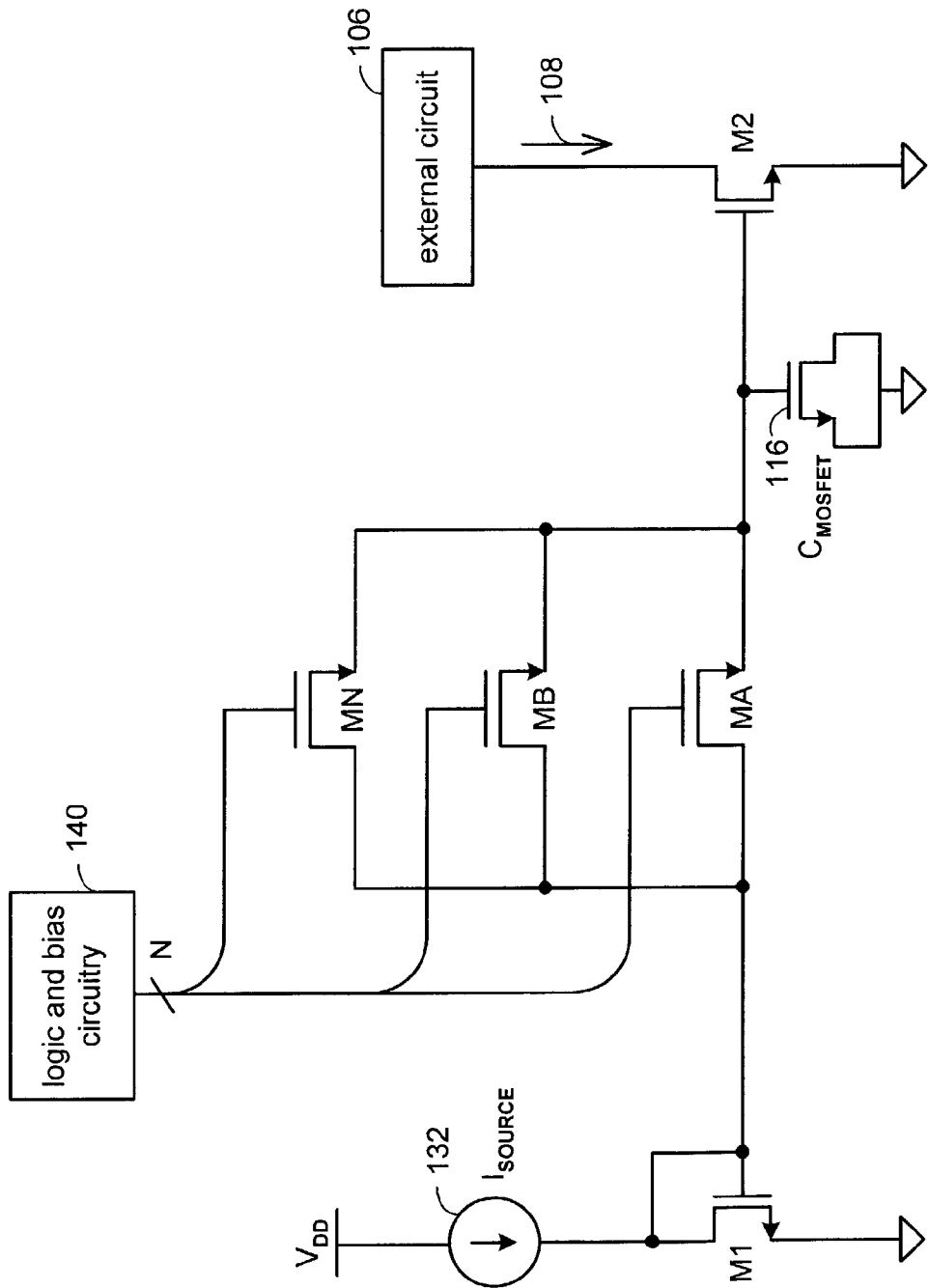
FIG. 7 is a schematic block diagram for setting multiple filter poles according to one embodiment of the present invention.

FIG. 7 is a schematic block diagram for setting multiple filter poles according to one embodiment of the present invention. In the embodiment of FIG. 7, the plurality of series of connected switches and selectable resistors of FIG. 6 have been replaced with a plurality of resistor-configured MOSFETs, namely MOSFETs MA, MB, and MN, coupled in parallel between the gates of first MOSFET M1 and second MOSFET M2. As shown in FIG. 7, current source 132 is coupled to the drain of first MOSFET M1. The ratio of the geometry of second MOSFET M2 to the geometry of first MOSFET M1 determines the level of bias signal 108 provided to external circuit 106 by second MOSFET M2. Typically, the ratio will be 2× or greater thereby allowing first MOSFET M2 to be a physically smaller device.

The plurality of resistor-configured MOSFETs, namely MOSFETs MA, MB, and MN, are biased into one of a linear (triode) mode of operation or a high impedance mode of operation by logic and bias circuitry 140. The triode mode of operation is a term left over from the vacuum tube days whose operation is similar to a field effect transistor. As is known by one of average skill in the art, when biased to a linear or triode mode of operation, the resistor-configured MOSFET functions as a resistor with a resistance determined by the MOSFET geometry, and when biased to the high impedance state, or "off", resistor-configured MOSFETs represent a near infinite impedance. Thus, by selecting the channel geometry of resistor-configured MOSFETs MA, MB and MN, the present invention can provide an improved filtering function as well as providing multiple filter poles, in conjunction with a capacitor or a capacitor-configured MOSFET 116, to meet a settle time requirement.

In the configuration shown in FIG. 7, first resistor-configured MOSFET MA can be formed to have a large resistance that will, in combination with capacitor 116, create a low frequency filter pole for improved filtering. Capacitor 116 is formed as a capacitor-configured MOSFET thus eliminating the need for an external capacitor. Second resistor-configured MOSFET MB can be formed to have a small resistance, thereby creating a high frequency pole that meets the fast charge time and the settle time requirement. The use of resistor-configured MOSFETs in place of integrated resistors greatly reduces the real estate required in the present invention. Logic and bias circuitry 140 comprises combinational logic controlled by one of the baseband processor or other system processor to control the low pass filter to meet either the settle time requirement or the improved filtering as necessary. Logic and bias circuitry 140 establishes the bias voltage on each resistor-configured MOSFET so they will operate in a linear or triode mode of operation with a small resistance that enables capacitor-configured MOSFET 116 to rapidly charge in order to meet a settle time requirement. Alternatively, logic and bias circuitry 140 can bias resistor-configured MOSFET MA into the linear or triode mode of operation forming a large resistance, thus meeting the improved filtering requirements.

Figure 8:
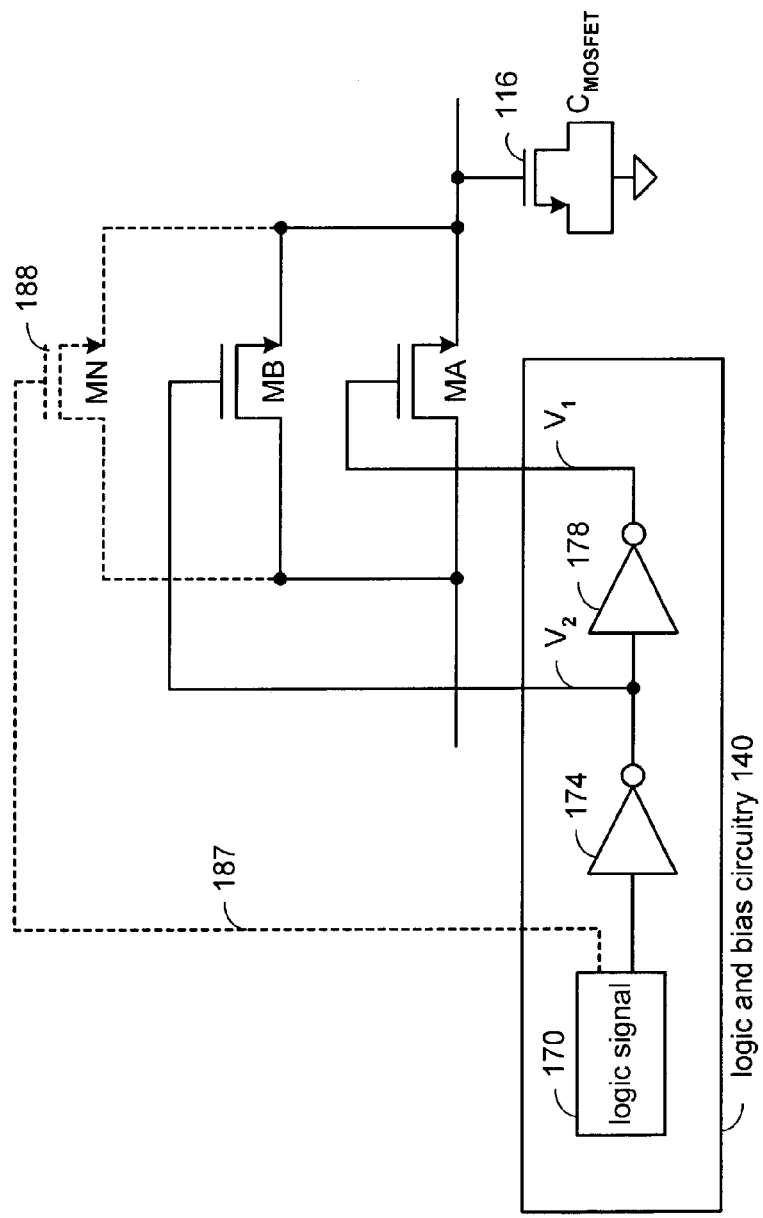
FIG. 8 illustrates the operation of logic and bias circuitry according to one embodiment of the present invention.

FIG. 8 illustrates the operation of logic and bias circuitry according to one embodiment of the present invention. As shown in FIG. 8, logic and bias circuitry 140 comprises a logic signal 170 coupled to a first inverter 174 with the output of first inverter 174 further coupled to a second inverter 178. The output of second inverter 178 couples a first voltage, $V_1$, to the gate of first resistor-configured MOSFET MA. The output of first inverter 174 couples a second voltage, $V_2$, to the gate of resistor-configured MOSFET MB.

Logic and bias circuitry 140 comprises logic signal 170 controlled by one of an external baseband processor or other system processor (not shown). In this example, logic signal 170 is a binary signal controlling resistor-configured MOSFETs MA and MB. One of average skill in the art can readily appreciate the various logic combinations to be employed to control more than two resistive devices. As shown in the accompanying truth table of FIG. 8, logic signal 170 will have only a true or false value. As shown in row 182, when logic signal 170 is true, the output of first inverter 174, $V_2$, will be zero, while the output of second inverter 178, $V_1$, will be substantially equal to the source voltage $V_{DD}$. As further shown in row 182, when the first voltage is $V_{DD}$, first resistor-configured MOSFET MA is biased into a linear mode of operation with an exemplary value of 100 kohms. Similarly, with the output of first invert 174 approximately zero, the resistance of resistor-configured MOSFET MB is nearly infinite.

Conversely, when logic signal 170 becomes false, as shown in row 186, the output of first inverter 174, $V_2$, will be near the supply voltage $V_{DD}$, while the output of second inverter 178, $V_1$, will be zero. In the configuration shown in row 186, resistor-configured MOSFET MA will be biased to an effective open circuit, while resistor-configured MOSFET MB will be biased to an exemplary 0.1 ohm resistance. When resistor-configured MOSFET MA is biased to 100 kohms, it forms a low frequency filter pole that improves filtering of the selectable filter pole circuitry. When resistor-configured MOSFET MB is biased into the linear mode of operation, it forms an exemplary resistance of 0.1 ohm, generating a high frequency filter pole that meets the fast charge time and settling requirement. While it is understood that these resistive values are exemplary in nature, they do represent approximate values that would be used in a typical integrated circuit design in conjunction with capacitor-configured MOSFET 116. Capacitor-configured MOSFET 116 will have exemplary values of 1 picofarad to approximately 100 picofarads.

The embodiment shown in FIG. 8 illustrates a two filter pole configuration. It should be understood by one of average skill in the art that additional filter poles can be created by adding additional resistor-configured MOSFETs in parallel to resistor-configured MOSFET MA and resistor-configured MOSFETs MB. For example, optional $N_{th}$ resistor-configured MOSFETs MN 188 and controlling bias voltage 187 are illustrated in dashed lines.

Figure 9:
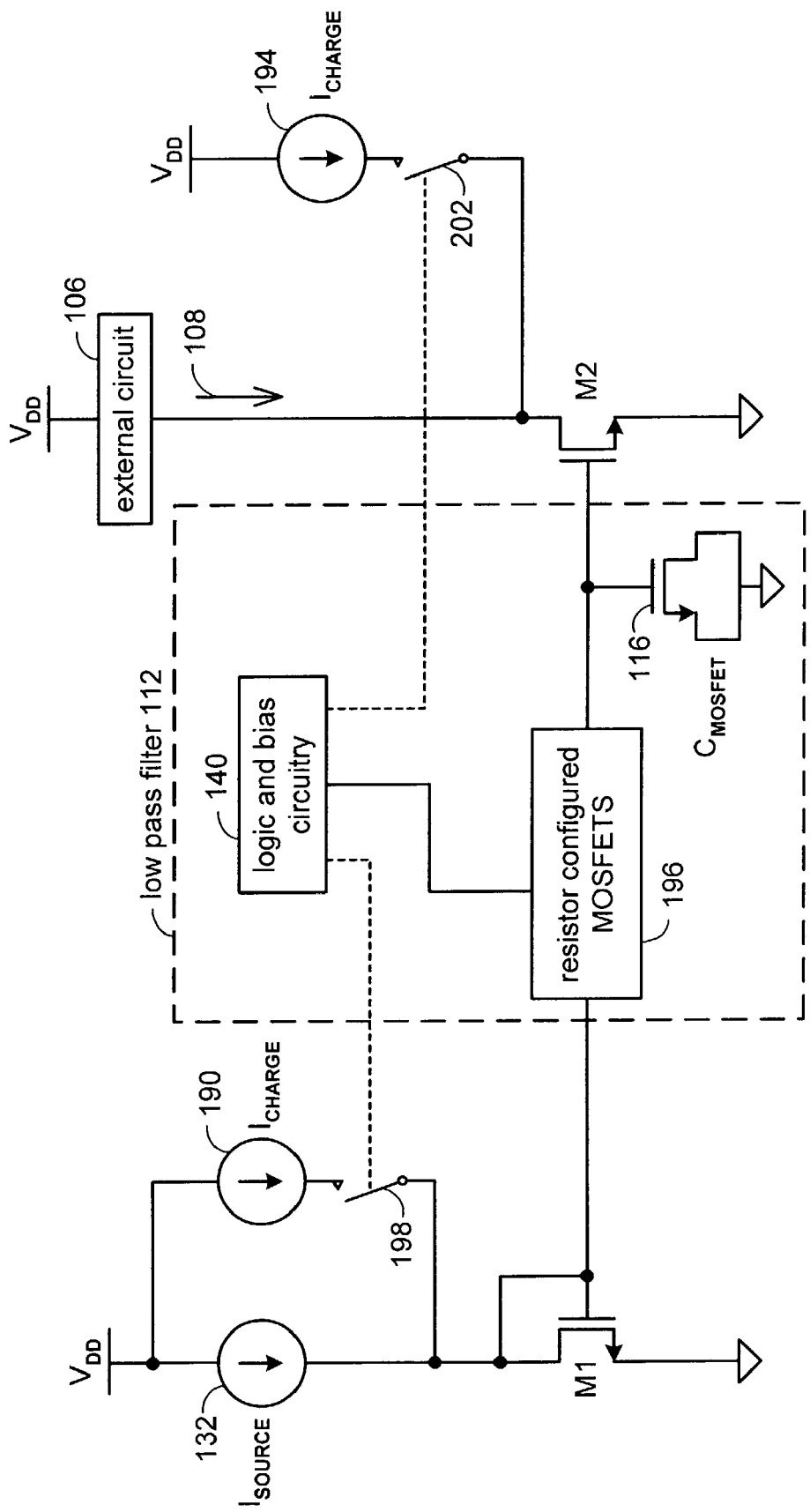
FIG. 9 illustrates an alternate embodiment of a current mirror with selectable filter poles.

FIG. 9 illustrates an alternate embodiment of a current mirror with selectable filter poles. In this configuration, the current mirror functions essentially as previously described, namely, current source 132 and first MOSFET M1 generate a corresponding bias signal 108 through second MOSFET M2. In this embodiment, a plurality of parallel-coupled current sources are momentarily coupled to the circuit to provide a fast charge time. More specifically, a first current source 190 is coupled in parallel with current source 132, both of which are coupled to the drain of second MOSFET M1. A second current source 194 is coupled to the drain of first MOSFET M2. First current source 190 and second current source 194 are controlled by MOSFET analog switches 198 and 202, respectively. In operation, logic and bias circuitry 140 closes MOSFET analog switches 198 and 202, thereby providing additional charge current coupled through resistor-configured MOSFETs 196 to charge capacitor-configured MOSFET 116. When MOSFET analog switch 198 is closed, current from first current source 190 is coupled into the drain of MOSFET M1. The current from first current source 190 and current source 132 significantly increases the charge rate on capacitor-configure MOSFET 116 thereby reducing the settling time. MOSFET analog switches 198 and 202 are opened once the capacitor-configure MOSFET 116 is fully charged.

The current from first current source 190 and current source 132 is mirrored by second MOSFET M2 resulting in an increased current into the drain of second MOSFET M2. This increase in bias signal 108 provided to external circuit 106 will, without other compensation, possibly overdrive external circuit 106. To compensate for the additional current mirrored in second MOSFET M2, second current source 194 is coupled to the drain of second MOSFET M2 by the closure of MOSFET analog switch 202, thus second MOSFET M2 conducts current from second current source 194 and external circuit 106 equal to current conducted by first MOSFET M1. In this configuration, a reduced settling time is achieved without changing the level of bias signal 108.

Figure 10:
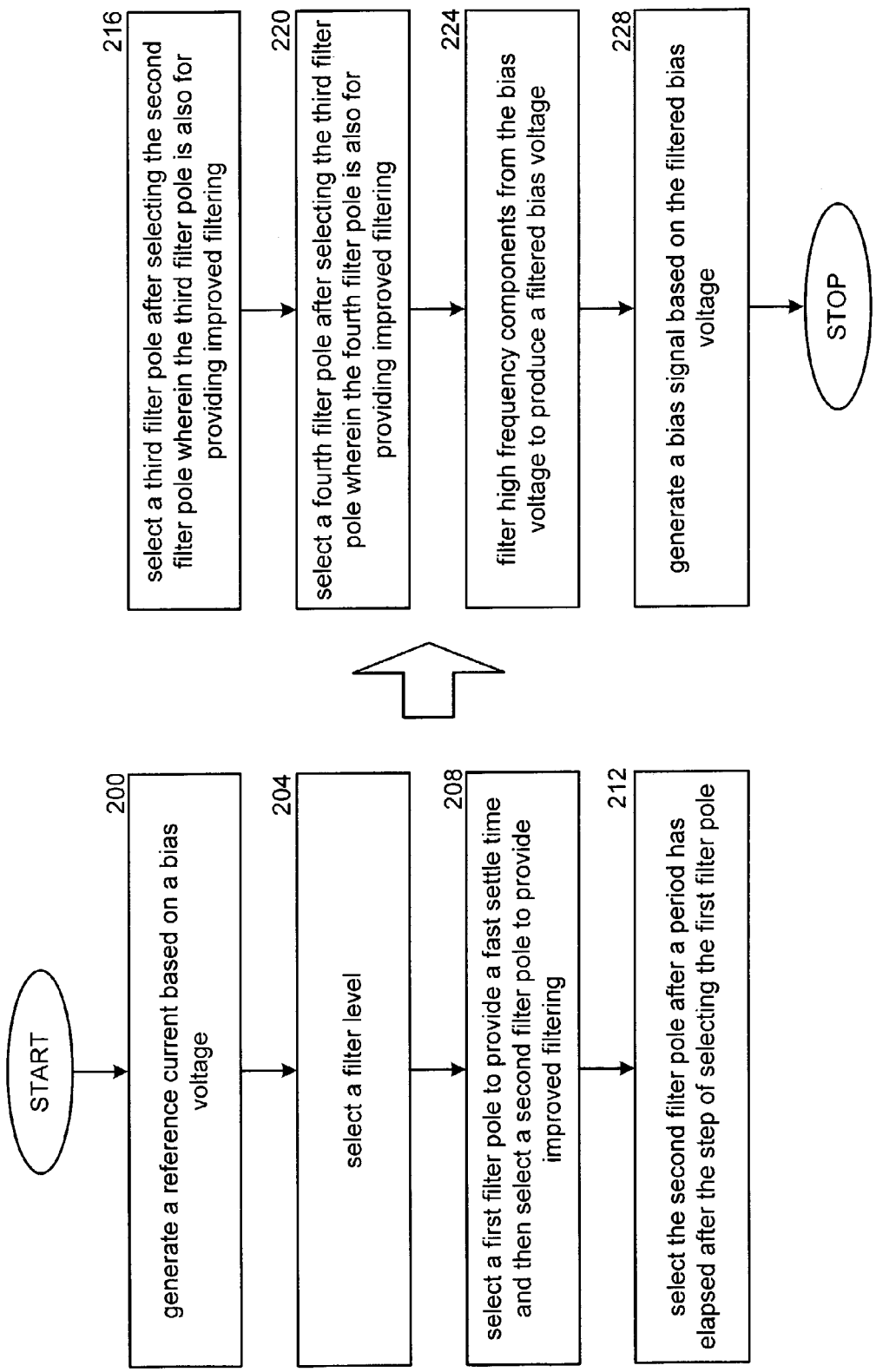
FIG. 10 is a flowchart illustrating a method for setting multiple filter poles in a current mirror according to one embodiment of the present invention.

FIG. 10 is a flowchart illustrating a method for setting multiple filter poles in a current mirror according to one embodiment of the present invention. A bias voltage is established to generate a reference current (step 200). In a current mirror, the reference current provided to a diode-connected MOSFET will be mirrored (replicated) by mirror MOSFETs to provide bias signals throughout the IC. Any high frequency components (noise) combined with the bias voltage will be replicated as well so it is advantageous to filter the bias voltage prior to coupling the bias voltage to the mirror MOSFETs. Prior to filtering, it is necessary to select a filter level (step 204). A low pass filter coupled between the diode-connected MOSFET and the mirror MOSFETs is formed with selectable filter poles wherein the filter poles are determined by bias and logic circuitry to select one of a fast settle time and an improved filtering. Logic and bias circuitry will select a first filter pole to provide a fast settle time and then select a second filter pole to provide improved filtering (step 208). The fast settle time requires a high frequency pole to rapidly charge a low pass filter capacitor so the bias signal can reach a steady state in a specified time period. The second filter pole is selected after a period has elapsed after the step of selecting the first filter pole (step 212). The second filter pole is formed as a low frequency pole to provide improved filtering. To further improve filtering, a third filter pole is selected after selecting the second filter pole (step 216) and a fourth filter pole is selected after selecting the third filter pole (step 220). After selecting the filter poles, the high frequency components are filtered from the bias voltage, by the low pass filter, to produce a filtered bias voltage (step 224) from which the mirror MOSFETs generate a bias signal based on the filtered bias voltage (step 228).

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

The invention claimed is:

1. A current mirror with selectable filter poles for providing a DC bias signal, comprising:
   a current source coupled to a supply;
   a first MOSFET having a drain coupled to receive current from the current source, a source coupled to a circuit common, and a gate coupled to the drain of the first MOSFET;
   a second MOSFET having a drain coupled to provide the bias signal and a source coupled to circuit common;
   a first selectable resistor coupled between a gate of the first MOSFET and a gate of the second MOSFET, respectively, wherein the first selectable resistor corresponds to a selectable filter pole for a low pass filter;
   a resistor coupled between the gates of the first and second MOSFETs in parallel to the first selectable resistor;
   a logic and bias circuitry coupled to select the first selectable resistor; and
   at least one capacitor-configured MOSFET coupled between the gate of the second MOSFET and circuit common, wherein the first selectable resistor and resistor provide one of a fast settle time and improved filtering according to logic and bias circuitry voltage.

2. The current mirror with selectable filter poles of claim 1 wherein the first selectable resistor comprises a first resistor-configured MOSFET having a drain and a source coupled between the gates of the first and second MOSFETs, respectively.

3. The current mirror with selectable filter poles of claim 2 wherein the logic and bias circuitry for selecting the first selectable resistor provides a voltage to a gate of the first resistor-configured MOSFET to selectably bias the first selectable resistor into one of a linear mode of operation and a high impedance mode of operation.

4. The current mirror with selectable filter poles of claim 1 wherein the resistor comprises a second resistor-configured MOSFET having a drain and a source coupled between the gates of the first and second MOSFETs, respectively, wherein the first resistor-configured MOSFET is for providing an improved filtering for the current mirror and wherein the second resistor-configured MOSFET is for providing a fast capacitance charge time to meet a settle time requirement.

5. The current mirror with selectable filter poles of claim 4 wherein, when the first and second resistor-configured MOSFETs are biased to have a resistive value, the first resistor-configured MOSFET has a resistive value that is at least ten times greater than a resistive value of the second resistor-configured MOSFET.

6. The current mirror with selectable filter poles of claim 4 wherein, when the first and second resistor-configured MOSFETs are biased to have a resistive value, the first resistor-configured MOSFET has a resistive value that is at least one hundred times greater than a resistive value of the second resistor-configured MOSFET.

7. The current mirror with selectable filter poles of claim 1 comprising a plurality of resistor-configured MOSFETs whose gates are coupled to the logic and bias circuitry and are selectably biased into one of a linear mode of operation and high impedance mode of operation.

8. A direct conversion Radio Frequency (RF) transceiver integrated circuit comprising:
   a local oscillator that generates an local oscillation signal corresponding to an RF channel;
   a receiver section operably coupled to the local oscillator to receive the local oscillation signal, wherein the receiver section receives an incoming RF signal, and wherein the receiver section down-converts the incoming RF signal based upon the local oscillation signal to produce an incoming baseband signal;
   a transmitter section operably coupled to the local oscillator to receive the local oscillation signal, wherein the transmitter section receives an outgoing baseband signal, and wherein the transmitter section up-converts the outgoing baseband signal to produce an outgoing RF signal;
   a current mirror with selectable filter poles for providing a DC bias signal to at least one of the local oscillator, the receiver section, and the transmitter section; and
   wherein the current mirror with selectable filter poles further comprises:
   a current source coupled to a supply;
   a first MOSFET having a drain coupled to receive current from the current source, a source coupled to a circuit common and a gate coupled to the drain of the first MOSFET;
   a second MOSFET having a drain coupled to provide the bias signal to at least one of the local oscillator, the receiver section, the transmitter section, and source coupled to circuit common;
   a first selectable resistor coupled between a gate of the first MOSFET and a gate of the second MOSFET, respectively, wherein the first selectable resistor corresponds to a selectable filter pole for a low pass filter;
   a resistor coupled between the gates of the first and second MOSFETs in parallel to the first selectable resistor;
   a logic and bias circuitry coupled to select the first selectable resistor; and
   at least one capacitor-configured MOSFET coupled between the gate of the second MOSFET and circuit common, wherein the first selectable resistor and resistor provide one of a fast settle time and improved filtering according to logic and bias circuitry voltage.

9. The direct conversion RF transceiver integrated circuit of claim 8 wherein the first selectable resistor comprises a first resistor-configured MOSFET having a drain and a source coupled between the gates of the first and second MOSFETs, respectively.

10. The direct conversion RF transceiver integrated circuit of claim 9 wherein the logic and bias circuitry for selecting the first selectable resistor provides a voltage to a gate of the first resistor-configured MOSFET to selectably bias the first selectable resistor into one of a linear mode of operation and a high impedance mode of operation.

11. The current mirror with selectable filter poles of claim 9 wherein the resistor comprises a second resistor-configured MOSFET having a drain and a source coupled between the gates of the first and second MOSFETs, respectively, wherein the first resistor-configured MOSFET is for providing an improved filtering for the current mirror and wherein the second resistor-configured MOSFET is for providing a fast capacitance charge time to meet a settle time requirement.

12. The direct conversion RF transceiver integrated circuit of claim 11, wherein, when the first and second resistor-configured MOSFETs are biased to have a resistive value, the first resistor-configured MOSFET has a resistive value that is at least ten times greater than a resistive value of the second resistor-configured MOSFET.

13. The direct conversion RF transceiver integrated circuit of claim 11 wherein, when the first and second resistor-configured MOSFETs are biased to have a resistive value, the first resistor-configured MOSFET has a resistive value that is at least one hundred times greater than a resistive value of the second resistor-configured MOSFET.

14. The direct conversion RF transceiver integrated circuit of claim 8 wherein the current mirror with selectable filter poles further comprises a plurality of resistor-configured MOSFETs whose gates are coupled to the logic and bias circuitry and are selectably biased into one of a linear mode of operation and high impedance mode of operation.

15. A current mirror with selectable filter poles for providing a bias signal, comprising:
   current means for generating a reference current;
   current mirror means for generating the bias signal based on the reference current;
   filtering means for selectively providing a low pass filter function with a plurality of selectable filter poles for providing one of an improved filtering for the current mirror and a fast capacitance charge time to meet a settle time requirement, wherein the filtering means further comprises:
   a first selectable resistor coupled between the gate of the first MOSFET and a gate of the second MOSFET, respectively, wherein the first selectable resistor corresponds to a selectable filter pole for a low pass filter;
   a resistor coupled between the gates of the first and second MOSFETs in parallel to the first selectable resistor;
   a logic and bias circuitry means coupled to select the first selectable resistor;
   at least one capacitor-configured MOSFET coupled between a gate of the second MOSFET and circuit common, wherein the first selectable resistor and resistor provide one of an improved filtering and a fast settle time according to logic and bias circuitry means; and
   wherein the gates of the first selectable resistor and resistor are coupled to receive a voltage from the logic and bias circuitry means; and
   logic and bias circuitry means for providing a voltage to the filtering means for selecting one of the plurality of selectable filter poles.

16. The current mirror with selectable filter poles of claim 15 wherein the first selectable resistor comprises a first resistor-configured MOSFET having a drain and a source coupled between the gates of the first and second MOSFETs, respectively.

17. The current mirror with selectable filter poles of claim 16 wherein the logic and bias circuitry means for selecting the first selectable resistor provides a voltage to a gate of the first resistor-configured MOSFET to selectably bias the first selectable resistor into one of a linear mode of operation and a high impedance mode of operation.

18. The current mirror with selectable filter poles of claim 17 wherein the resistor comprises a second resistor-configured MOSFET having a drain and a source coupled between the gates of the first and second MOSFETs, respectively, wherein the first resistor-configured MOSFET is for providing an improved filtering for the current mirror and wherein the second resistor-configured MOSFET is for providing a fast capacitance charge time to meet a settle time requirement.

19. The current mirror with selectable filter poles of claim 18 wherein, when the first and second resistor-configured MOSFETs are biased to have a resistive value, the first resistor-configured MOSFET has a resistive value that is at least ten times greater than a resistive value of the second resistor-configured MOSFET.

20. The current mirror with selectable filter poles of claim 19 wherein, when the first and second resistor-configured MOSFETs are biased to have a resistive value, the first resistor-configured MOSFET has a resistive value that is at least one hundred times greater than a resistive value of the second resistor-configured MOSFET.

21. A bias circuit within an integrated circuit for providing a bias signal, comprising:
- a first current source coupled to a supply;
- a second selectable current source coupled in parallel to the first current source;
- a current mirror including:
  - a first MOSFET having a drain coupled to receive current from the first current source, a source coupled to a circuit common, and a gate coupled to the drain of the first MOSFET;
  - a second MOSFET having a drain coupled to provide the bias signal and a source coupled to circuit common;
  - a capacitor coupled between gates of the first and second MOSFETs and circuit common; and
  - a selectable pole filter circuitry coupled between the gates of the first and second MOSFETs;
- a logic and bias circit operably disposed to select a pole of the selectable pole filter circuitry;
- a third selectable current source coupled between the supply and the current mirror; and
- wherein the logic and bias circuitry is operable to selectably provide voltage to the selectable pole filter circuitry and is further operable to select the second and third selectable current sources.

* * * * *